(12) United States Patent
Jafari et al.

(10) Patent No.: US 6,794,889 B2
(45) Date of Patent: Sep. 21, 2004

(54) UNIFIED APPARATUS AND METHOD TO ASSURE PROBE CARD-TO-WAFER PARALLELISM IN SEMICONDUCTOR AUTOMATIC WAFER TEST, PROBE CARD MEASUREMENT SYSTEMS, AND PROBE CARD MANUFACTURING

(75) Inventors: Nasser Ali Jafari, Sunnyvale, CA (US); Kenneth Dean Karklin, San Francisco, CA (US); William T. Sprague, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/133,165

(22) Filed: Apr. 26, 2002

(65) Prior Publication Data

US 2003/0201764 A1 Oct. 30, 2003

(51) Int. Cl.$^7$ ............................................... G01R 31/02
(52) U.S. Cl. ..................... 324/758; 324/158.1; 361/143
(58) Field of Search .................................. 324/758, 757, 324/754, 761, 765, 158.1; 361/143; 438/17, 18, 14

(56) References Cited

U.S. PATENT DOCUMENTS

| | | | |
|---|---|---|---|
| 5,585,738 A | | 12/1996 | Kuji et al. |
| 5,642,056 A | | 6/1997 | Nakajima et al. |
| 5,804,983 A | * | 9/1998 | Nakajima et al. ........... 324/758 |
| 5,861,759 A | | 1/1999 | Bialobrodski et al. |
| 5,974,662 A | | 11/1999 | Eldridge et al. |
| 6,040,700 A | * | 3/2000 | Berar .......................... 324/754 |
| 6,043,668 A | * | 3/2000 | Carney ........................ 324/758 |
| 6,060,892 A | | 5/2000 | Yamagata |
| 6,107,813 A | | 8/2000 | Sinsheimer et al. |
| 6,509,751 B1 | * | 1/2003 | Mathieu et al. .............. 324/754 |
| 6,586,956 B2 | * | 7/2003 | Aldaz et al. ................. 324/758 |

* cited by examiner

*Primary Examiner*—Jimmy Nguyen

(57) ABSTRACT

A planarization gauge assures probe card-to-wafer parallelism in semiconductor automatic test equipment (ATE) used for wafer test, and provides a standard system reference plane during the building and testing of ATE components. The planarization gauge has two planar and parallel surfaces that may serve as a system reference plane. The planarization gauge has at least one access hole for a depth gauge, and at least one optical target recognizable by a prober's upward looking camera. The planarization gauge is mechanically interchangeable with a probe card; thus, it is compatible with different planarization methods and platforms used in building and testing ATE components. The planarization gauge is manufactured and inspected in a manner as to assure traceability to established standards such as NIST. When used by all ATE vendors, the planarization gauge ensures correlation between the vendors' various planarization methods.

27 Claims, 8 Drawing Sheets

UNIFIED APPARATUS AND METHOD TO ASSURE PROBE CARD-TO-WAFER PARALLELISM IN SEMICONDUCTOR AUTOMATIC WAFER TEST, PROBE CARD MEASUREMENT SYSTEMS, AND PROBE CARD MANUFACTURING

FIELD OF THE INVENTION

The invention is directed towards the field of semiconductor automatic test equipment, and more specifically, towards probe card-to-wafer parallelism (also described as planarity) in semiconductor automatic test equipment at wafer probe.

BACKGROUND OF THE INVENTION

Automatic Test Equipment Configuration

Within the semiconductor industry, an essential step in the manufacturing process is wafer test, also known as wafer probe or wafer sort. During wafer sort, each individual die on the wafer is electrically tested for functionality before packaging. FIG. 1A is a high-level sketch showing a sample configuration of the automated test equipment (ATE), also known as an ATE test cell or test cell, used in wafer sort. This configuration shall hereinafter be referred to as a direct-docking system. The equipment that controls and runs the tests on the wafer is called a tester 101. The tester 101 has a moveable test head 103 that is positioned over a wafer 105 during test. A prober 107 loads and unloads each wafer 105 onto a prober stage 109. The prober stage 109 (also known as a prober chuck) maneuvers each wafer 105 into position for testing, and is capable of movement in x-, y-, and z-directions. An arrow 121 points in the direction of the z-axis for the system. The x- and y-axis are in the plane of the wafer 105. In this ATE test cell configuration, the test head 103 rests on docking supports 111, which are adjustable in height. In other test cell configurations, the test head 103 may be suspended above the prober 107 using appropriate means other than docking supports.

The test head 103 makes contact with the wafer 105 via probe card 113, which can be attached to the tester interface 120 with a number of possible mechanisms, including but not limited to vacuum attachment, mechanical latching, or retention using electromechanical connectors. In some alternate test cell configurations, such as the one shown in FIG. 1B, the probe card 113 is mounted directly onto a prober head plate 114 of the prober 107. The configuration of FIG. 1B shall hereinafter be referred to as a conventional docking system. The probe card 113 holds an array of probes 115 that have been manufactured to line up with contact pads on the wafer 105. Ideally, all of the probes 115 are aligned in the same plane, parallel to the wafer surface, such that contact is made with all of the contact pads on the wafer 105 simultaneously, minimizing the required z-direction travel of the prober stage 109. The probe depth 116 is defined to be the distance in the z-direction from the tester interface 120 to the tip of the probes 115 as illustrated in FIG. 1A. Each probe card 113 is custom-made for the specific circuitry of the wafer 105 that is to be tested, and has an interface that is electrically and mechanically matched to the tester specific interface on the test head 103. The prober 107 typically has a prober vision system with an upward looking camera 117 that can optically measure distances in the z-direction. A fixed point, usually the center of x-y travel of the prober stage 109, is designated as the probing center of the ATE.

The test cell has a system reference plane 119, which is typically a flat surface on a mechanical portion of the test cell. The system reference plane 119 is the surface against which the planes of other surfaces in the test cell are measured relative to. In the direct docking system of FIG. 1A, the system reference plane 119 is also the tester interface 120. In other test cell configurations, such as a conventional docking system, the system reference plane 119 may be another surface such as the prober head plate 114 or other flat surface. Each probe card 113, depending upon the probe technology employed and other application-specific factors, has a manufacturing planarity tolerance, which specifies the maximum distance that can be tolerated between the lowest and highest hanging probe 115 on the probe card 113 before the wafer 105 can no longer be accurately tested. The components that make up a test cell, consisting of tester 101, prober 107, and probe card 113, are typically supplied and supported by different vendors. For example, it is very common for the tester 101 to be supplied by one vendor, the prober 107 supplied by another, and the probe card 113 supplied by a third vendor.

Probe Card Planarization

Before wafer sort, it is imperative that the probe card 113 is leveled so that the tips of the probes 115 lie in a single plane, parallel to the wafer surface. This process, known as probe card planarization, ensures that the probes 115 all simultaneously contact the corresponding pads on the wafer 105. FIG. 2 shows an ATE test cell (a direct docking system) in which the test head 103 and probe card 113 are slightly tilted (exaggerated for clarity in the figure) and therefore not parallel to the wafer 105. As the test head 103 is brought down to rest upon the docking supports 111, the first probe 115A contacts the wafer 105 before any of the other probes 115. The test head 103 cannot be positioned any lower without damaging the first probe 115A and/or the wafer circuitry, but the remaining probes 115 have yet to make contact with the wafer 105. The test head 103 and probe card 113 must be leveled and made substantially parallel to the wafer 105 (within the tolerance of each ATE test cell) by adjusting the height of the docking supports 111, before the wafer 105 can be successfully tested. Probe cards 113 in conventional docking systems also require planarization before running wafer sort. In conventional docking systems, the probe card 113 is planarized by making adjustments to the prober head plate 114.

There are various ways to planarize a probe card 113. One method, used in direct docking systems, requires using a custom-made leveling apparatus. The leveling apparatus is mounted onto the docking supports 111 of the prober 107, and has three holes in its body that are positioned above the prober stage 109. A mechanical depth gauge is inserted into each hole to measure the distance between the leveling apparatus (which is a planar reference surface) and the prober stage 109. The height of each docking support 111 is adjusted until the measured distances are equal, indicating the docking supports 111 themselves are planar. If the docking supports 111 are planar, then it is presumed the test head 103 and its probe card 113 will also be planar when the test head 103 is set down upon the docking supports 111.

Unfortunately, the described leveling apparatus is flawed because it does not replicate the physical setup of the ATE test cell during wafer sort. Once the leveling apparatus is removed and the test head 103 is lowered onto the docking supports 111, the weight of the test head 103 (which can exceed 1000 pounds in some systems) alters the height of the docking supports 111 so that the test head 103 is no longer planarized. Furthermore, the leveling apparatus cannot utilize the measurement capabilities of the upward looking camera 117, nor can it be used in conventional docking systems Another probe card planarization method is described in U.S. Pat. No. 5,861,759 to Bialobrodski et al. U.S. Pat. No. 5,861,759 uses the prober's upward looking camera to gauge the distance between 3 selected probes on the probe card. The test head rests on one fixed support and 2 adjustable, motorized supports. The camera communicates to a central microprocessor any adjustments that need to be made to the tilt of the test head in order to planarize the probe points to the wafer surface. In response, the central microprocessor adjusts the height of the motorized supports accordingly. Unfortunately, this method and apparatus requires additional setup steps and a costly motion control system to control the motorized supports.

Planarity Verification Methods

To ensure probe card planarity, any component that interfaces with the wafer 105 and/or probe card 113 must also be planar and, in combination with the other components, meet the manufacturing planarity tolerance of the ATE. The prober stage 109, the probe card 113 and probes 115, and the system reference plane 119 should all be planar and parallel to each other in the final assembly. Vendors verify the planarity of their components by measuring the distance between a known, flat reference plane and the surface in question at multiple points. If the distances are equal, then the surface is verified to also be planar and parallel to the reference plane. Unfortunately, the vendors use completely different methods and tools to verify planarity. As a result, the different verification methods may not necessarily correlate to each other; that is, a surface that is determined to be planar using one method may not necessarily be found planar using another method.

To verify the planarity of a prober stage 109, one prober vendor attaches images of crosshair targets in three different locations onto a dummy probe card. The dummy probe card serves as the system reference plane 119, and is installed into a tester interface emulator that is mechanically equivalent to the tester interface 120 in the ATE in which the prober 107 will be used. Then, the upward looking camera 117 is used to measure the distance between each crosshair target and the prober stage 109. When the three distances are equal, the prober stage 109 is determined to be planar and parallel to the dummy probe card.

Another prober vendor uses a dummy probe card with three holes as a system reference plane 119. The dummy probe card is installed into a tester interface emulator. The tester interface emulator has a center opening large enough to expose the holes on the tester side of the dummy probe card. The holes are wide enough to let the plunger of a mechanical depth gauge pass through to make measurements. This allows the mechanical depth gauge to measure the distance between the system reference plane 119 of the dummy probe card and the surface of the prober stage 109. When the three distances are equal, the prober stage 109 is determined to be planar and parallel to the dummy probe card.

The probe card vendor uses an altogether different method to verify planarity of the probe points on a probe card 113. Due to the complexity of the probe array, a special instrument known as a metrology tool is used to check that a probe card 113 is planar to its probes 115. The metrology tool, which is provided by yet another vendor, also needs to have its planarity verified. Verification of the metrology tool can be performed in various ways, including the above-mentioned method of using a dummy probe card with holes.

In all of these aforementioned examples, the vendors rely on their own measurement instruments, tools, emulations of the tester interface 120, and/or emulations of the system reference plane 119 to verify planarity during the various stages of probe card manufacturing, measurement, and use. Unfortunately, with each vendor using a different method to determine planarity, and few (if any) of these methods providing for measurement traceability, often the disparate tools and methods do not correlate to each other. This lack of correlation causes probe card planarization difficulties during production, which means valuable time that could have been used in wafer sort must be wasted in planarizing the probe card 113 instead.

The use of non-correlating verification methods may also result in the erroneous rejection of a good probe card during wafer sort. For example, the probe tips on probe cards 113 should lie in a plane parallel to the system reference plane 119 of the subject ATE test cell. The probe tips's planarity is verified by the probe card vendor. However, if the methods of verifying planarity in the ATE test cell do not correlate with the probe card vendor's methods, then it may be impossible to planarize the probe card 113 in the ATE test cell. In most such cases, the probe card is assumed to be defective (even though the probe card vendor had already independently verified the probe tips' planarity) and returned to the probe card vendor. These types of mistakes increase reject rates, probe card inventory requirements, and average setup time for an ATE test cell.

Miscorrelation between verification methods of different vendors is not the only problem. There may also be lack of correlation between a vendor's own internal manufacturing and verification methods. For example, the probe card vendors have tip-planarizing tools (such as a sanding station or tip-etch system) that are used during the manufacturing process to sand, etch, or otherwise align the probe tips of a probe card within a plane. Then, the planarity of the probe tips is verified using a metrology tool. However, there can be miscorrelation between the tip-planarizing tools and the metrology tool. Miscorrelation between such internal tools is a problematic source of yield fallout in the probe card manufacturing environment.

Better Planarization Tool and Better Correlation Needed

Therefore, a need remains for an improved planarization tool, one that can more accurately replicate the physical setup of the ATE test cell during wafer sort and be used with the upward looking camera 117. There is also a need for better correlation between the various planarity verification methods used by the vendors, as well as better correlation between manufacturing and planarity verification tools. These needs are especially urgent as wafers (and the probe cards to test them) grow larger in array size and manufacturing planarity tolerances become stricter. The solution should be compatible with direct-docking and conventional docking systems, as well as with the different methods and platforms used by vendors to fashion and verify the planarity in the components of an ATE.

SUMMARY OF THE INVENTION

The present invention meets the above-mentioned needs. In accordance with an illustrated preferred embodiment of the present invention, a planarization gauge has a mechanical layout identical to that of a probe card 113, so as to be mechanically interchangeable with a probe card 113. The planarization gauge is installed in the tester 101 or tester interface emulator in the same manner as a probe card 113. The planarization gauge is functionally and mechanically compatible with the ATE in which it is to be used, and is built within the manufacturing planarity tolerance of the ATE. The planarization gauge provides a front planar surface and a back planar surface, which are substantially parallel to each other. Either or both of the surfaces may be used as a system reference plane 119 when verifying planarity in the individual components of the ATE. During probe card planarization in the ATE test cell, the back planar surface is typically blocked by the test head 103, but the front planar surface remains accessible as a system reference plane 119. The planarization gauge is a single tool that provides depth gauge access holes for measurements using depth gauges, and optical targets for measurements using an upward looking camera 117. An optical target is hereinafter defined as any image or object that can be recognized by an upward looking camera 117 and used as an endpoint in a measurement of distance.

Since the planarization gauge is mechanically interchangeable with a probe card 113, the planarization gauge can be used in any ATE configuration, such as direct-docking or conventional docking systems. In a direct-docking system, the planarization gauge can be used while latched to the test head 103. The test head 103 can be set down on the docking supports 111 during planarization, thus replicating the physical setup of the ATE during wafer sort. Also, due to its interchangeable nature, the planarization gauge is compatible with conventional docking systems, as well as with the different methods and platforms used by vendors while building and verifying individual ATE test cell components. It can be used by the aforementioned prober vendors in place of the dummy probe cards. The probe card vendor and metrology tool vendor can use it to verify a metrology tool. Each vendor can also use it to calibrate and correlate internal manufacturing and planarization processes by verifying their own tools with the same planarization gauge. When used by all the ATE vendors, the planarization gauge provides a uniform standard for building and verifying all ATE components, ensuring correlation between the various methods of verifying planarity. Furthermore, the planarization gauge can be manufactured and inspected in a manner as to provide traceability to a standard, such as National Institute of Standards and Technology (NIST). Additionally, it serves as an excellent debugging tool for determining which components are at fault when probe card planarization is a problem.

One embodiment of the planarization gauge consists of a front plate fastened to a back plate. One surface of the back plate is the back planar surface of the planarization gauge; one surface of the front plate is the front planar surface of the planarization gauge. The back plate is adapted to attach to a test head 103 in the same manner as a probe card 113. The front plate, made of glass, has three optical targets etched onto the front planar surface. In addition to the three optical targets, three depth gauge access holes run through the back and front plates, large enough to allow room for the plunger of a mechanical depth gauge to fit through.

Vendors using a mechanical depth gauge to measure planarity insert its plunger through the depth gauge access holes, using the back planar surface as the system reference plane 119. Vendors using an upward looking camera 117 optically measure the distance to the optical targets, using the front planar surface as the system reference plane 119. Either method of verifying planarity is valid and will correlate to the other method, since the back and front planar surfaces are parallel and planar within a strict tolerance. The depth gauges used with the planarization gauge are not limited to just mechanical depth gauges, either. Any other instrument that is capable of measurement in the z-direction with a precision sufficient for the ATE in question can also be used. Laser measurement equipment is one such alternative instrument.

The optical targets in this embodiment are singular dots that are recognizable by a prober vision system utilizing, for example, the prober's upward looking camera 117. Directional lines, also etched onto the glass, trace two paths from the center of the front plate to each optical target. The first path is a direct path from the front plate center to each target. The second path is broken down into x- and y-vectors. The directional lines in this embodiment allow an ATE operator to locate the tiny optical targets with ease, especially when the front planar surface is viewed at magnification through the upward looking camera 117. Additional directional lines to the optical targets may be added. Alternatively, the routine for locating and focusing on the dots of the planarization gauge can be automated and run by the prober 107.

The distance from the probing center to an optical target is hereinafter defined as an optical target radius, and the distance from the probing center to a docking support 111 in a direct-docking system is hereinafter defined as a docking support radius. Each docking support 111 has a corresponding optical target. The optical targets can be positioned at locations that duplicate, on a smaller and proportional scale, the locations of the docking supports 111 on the prober 107. The optical targets are located within the radial axis of the docking supports 111, and are positioned such that the ratio of each optical target radius to its respective docking support radius is the same.

Planarizing the test head 103 to the prober stage 109 becomes a straightforward process in a direct-docking system when the optical target radii are proportional to the docking support radii. First, the planarization gauge is latched onto the test head 103. Then, the distance between the prober stage 109 and each of the three optical targets is measured. The difference between the three measurements is proportional to the height adjustments that need to be made to the docking supports 111. This method of positioning the optical targets is optional and is not needed in a conventional docking system.

In an alternate embodiment, the planarization gauge is a single plate with parallel back and front planar surfaces. The front planar surface has three optical targets. These optical targets can be probes 115, probe-like protrusions, light-colored dots against a dark background, or any other image or object recognizable by the upward looking camera 117. The single plate also has three holes that allow access for a depth gauge. The single plate is adapted to attach to a test head 103 in the same manner as a probe card 113.

Further features and advantages of the present invention, as well as the structure and operation of preferred embodiments of the present invention, are described in detail below with reference to the accompanying exemplary drawings. In the drawings, like reference numbers indicate identical or functionally similar elements.

DETAILED DESCRIPTION

Figure 1A:
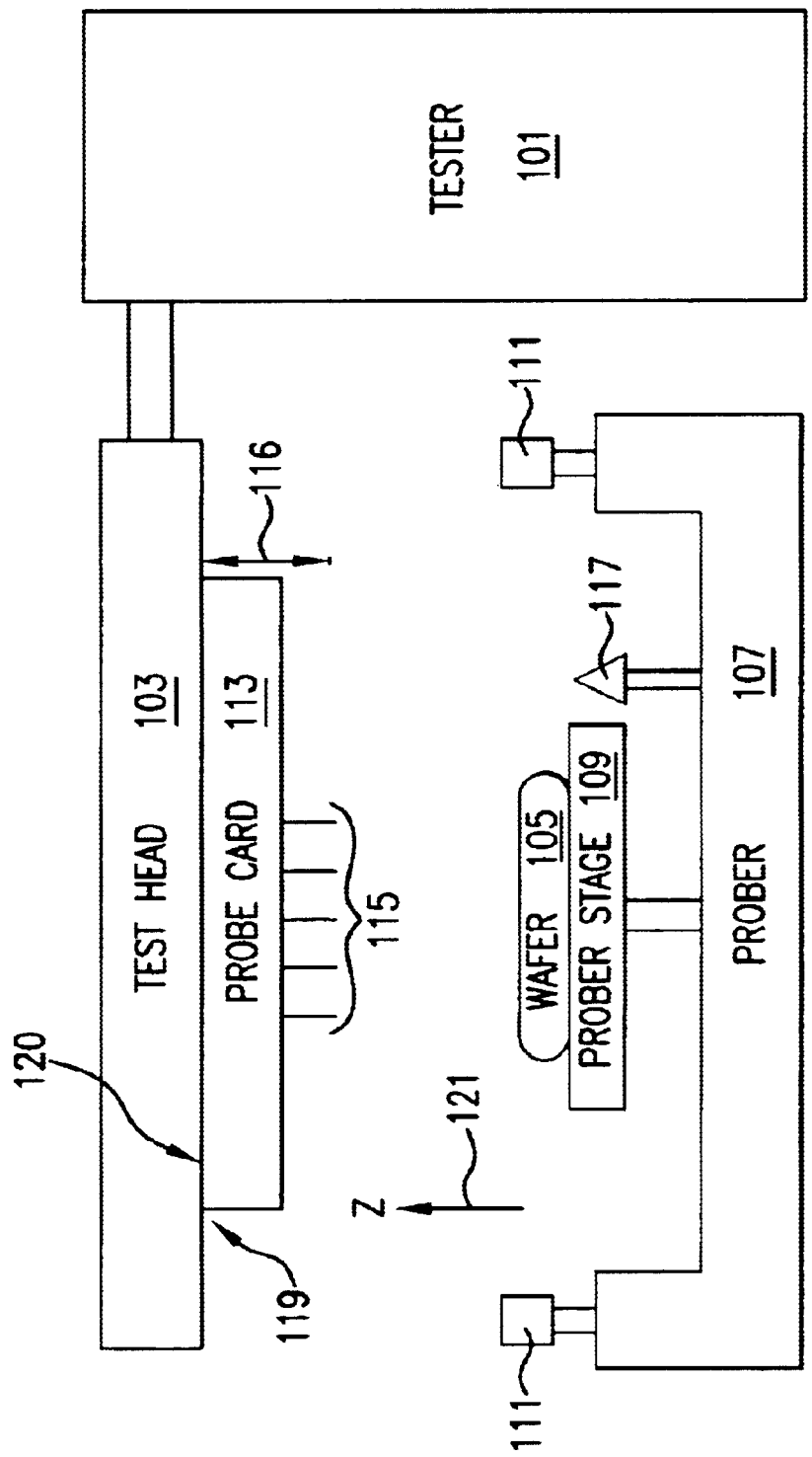
FIG. 1A is a high-level sketch showing the typical automated test equipment (ATE) used in wafer sort.
Figure 1B:
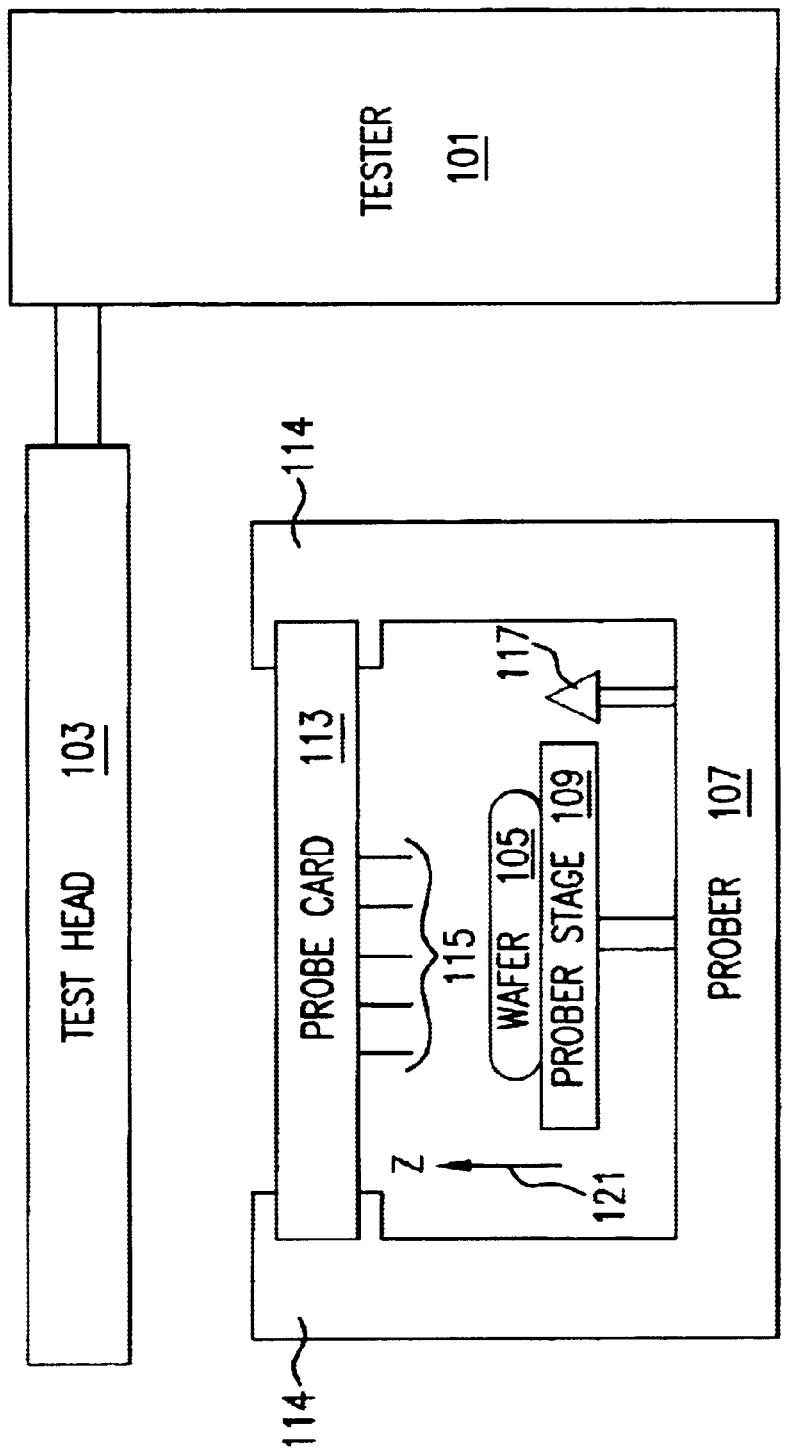
FIG. 1B is a high-level sketch showing an alternate configuration of ATE used in wafer sort.
Figure 2:
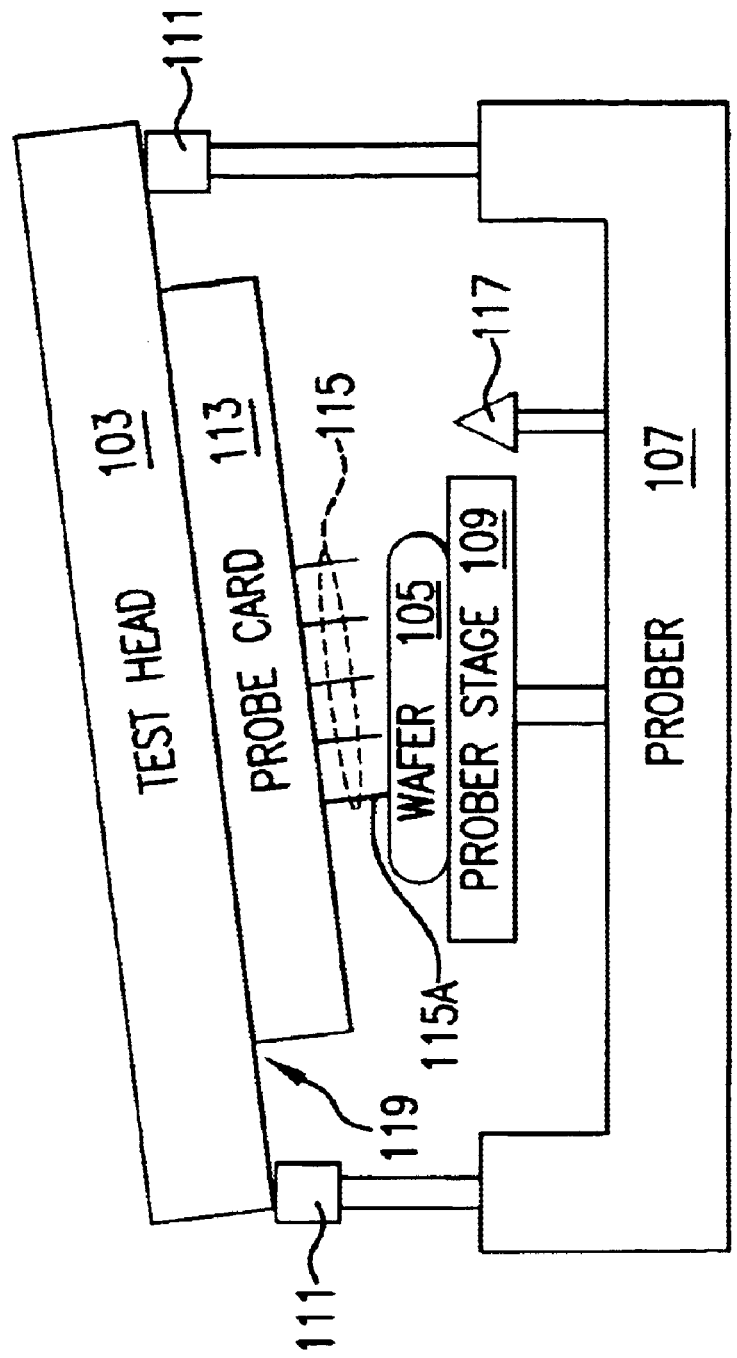
FIG. 2 shows a system in which the test head and probe card are not planarized to the wafer surface.
Figure 3:
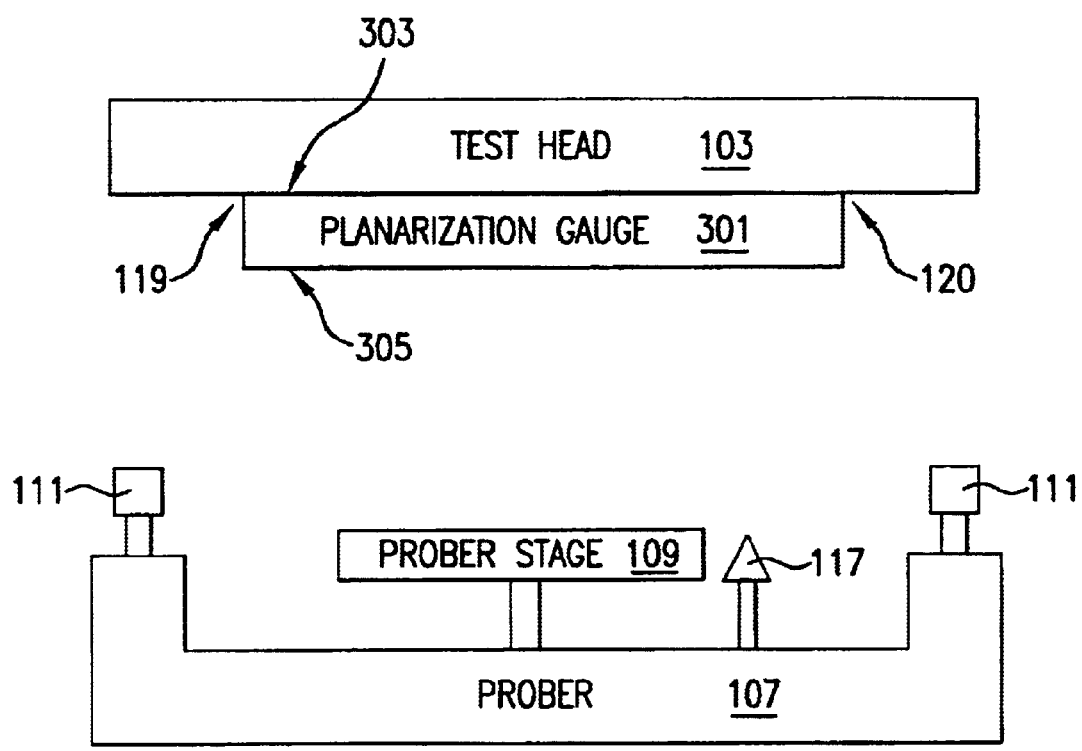
FIG. 3 shows a high-level sketch of an ATE with a planarization gauge installed.

FIG. 3 shows a high-level sketch of an ATE test cell with a planarization gauge 301 installed. The planarization gauge 301 has a back planar surface 303 and a front planar surface 305, both of which are substantially planar and substantially parallel to each other. Either or both the back planar surface 303 and the front planar surface 305 may be used as a system reference plane 119 in verifying the planarity in the individual components of the ATE test cell. When attached to the test head 103 during probe card planarization, the back planar surface 303 is typically blocked by the test head 103, but the front planar surface 305 remains accessible as a system reference plane 119. The planarization gauge 301 has depth gauge access holes running through its structure, and optical targets on the front planar surface 305 for measurements using an upward looking camera 117. An optical target is hereinafter defined as any image or object that can be recognized by an upward looking camera 117 and used as an endpoint in a measurement of distance. Because FIG. 3 shows a side view of the planarization gauge 301, neither the depth gauge access holes nor the optical targets can be seen.

The planarization gauge 301 is mechanically interchangeable with a probe card 113, so it can be used while latched to the test head 103. For example, in direct-docking systems during planarization of the probe card 113, the test head 103 can be directly set down upon the docking supports 111, thus replicating the physical setup of the ATE test cell during wafer sort. Because the planarization gauge 301 is interchangeable with a probe card 113, it is compatible with conventional docking systems, too. It is also compatible with the different methods and platforms used by vendors in building the individual components in a test cell, and in verifying their planarity.

Figure 4A:
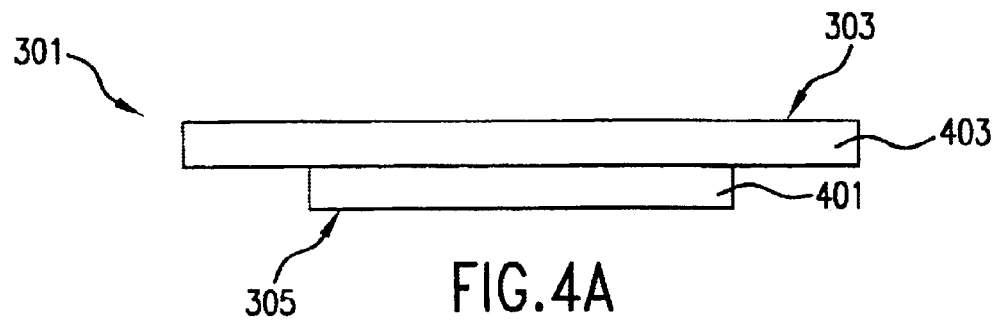
FIG. 4A is a side view of a preferred embodiment of a planarization gauge, made in accordance with the teachings of the present invention.

FIG. 4A is a side view of a preferred embodiment of the planarization gauge 301, made in accordance with the teachings of the present invention. A front plate 401 is centered and secured to a back plate 403 using screws, adhesives, latches, or any other well-known means of attachment. When the planarization gauge 301 is installed into an ATE test cell, the back planar surface 303 faces the test head 103, and the front planar surface 305 faces the prober 107.

Figure 4B:
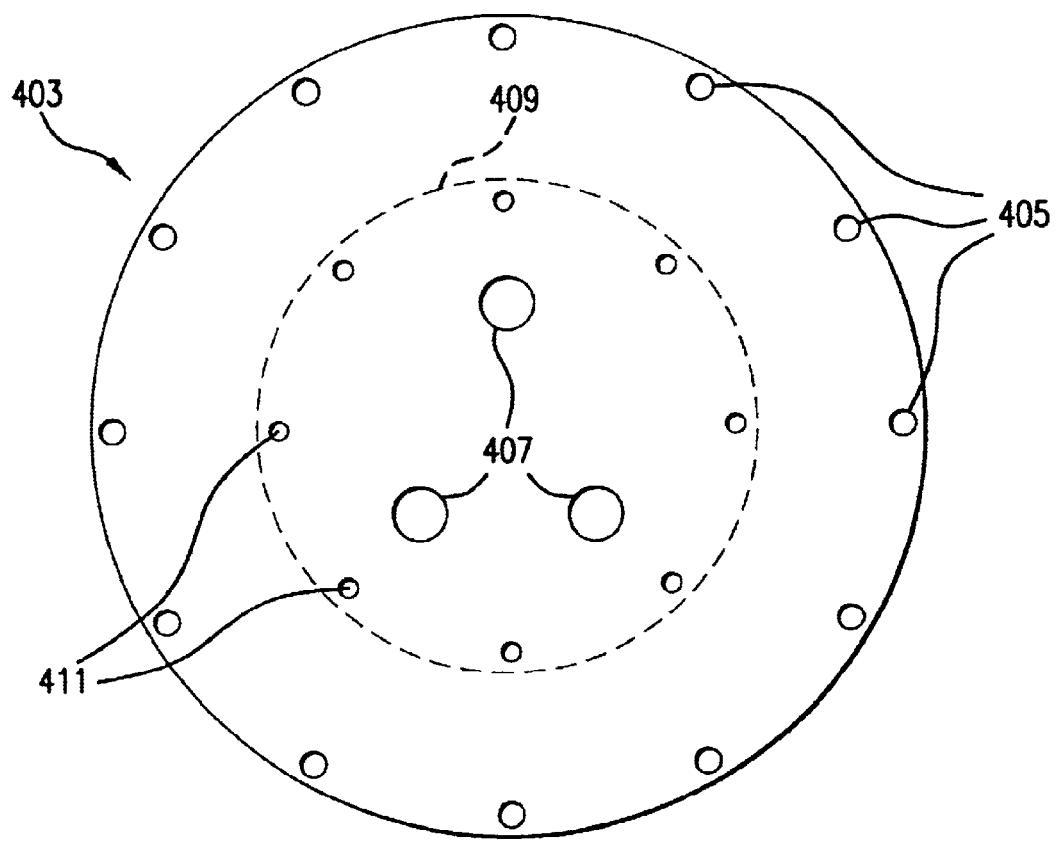
FIG. 4B shows a top view of the back plate of a planarization gauge.

FIG. 4B shows a top view of the back plate 403, as seen from the prober side of the ATE test cell. The back plate 403 is adaptable to attach to a test head 103, in the same manner as a probe card 113. The embodiment shown in FIG. 4B has outer edge holes 405 that fasten to a frame (not shown) that, in turn, mates to the test head 103. Other methods of adapting the back plate 403 to fit a test head 103 are possible. The back plate 403 has three depth gauge access holes 407 that are large enough for the plunger of a mechanical depth gauge to fit through. The depth gauge access holes 407 are usually blocked when the planarization gauge 301 is latched into an actual test head 103, but are accessible when the planarization gauge 301 is latched into a tester interface emulator. Most tester interface emulators have a center opening through which the depth gauge access holes 407 can be reached. However, the center opening is limited in size, so the depth gauge access holes 407 must be positioned to fall within the center opening when the planarization gauge 301 is installed into the tester interface emulator. The size of the center opening may vary among the different tester interface emulators. For illustrative purposes only, in an actual working embodiment, the depth gauge access holes 407 are approximately 6.5 mm in diameter, and located within a 6.3-inch radius of the center of the back plate 403.

The dashed circle 409 represents the location of the front plate 401 when it is fastened to the back plate 403. The front plate 401 can be fastened to the back plate 403 using screws into screw holes 411 drilled into the back plate 403. The back planar surface 303 of back plate 403 should be very flat, so as to provide a good system reference plane 119. The planarity of the back planar surface 303 should meet the manufacturing planarity tolerance of the ATE test cell with which it will be used. For illustrative purposes only, in an actual working embodiment, the back plate 403 is approximately 355.6 mm in diameter, 6.35 mm thick, and the back planar surface 303 is planar within 5 um. The back plate 403 can be made of any rigid material such as stainless steel, aluminum, or titanium, although lightweight materials are preferred so that the planarization gauge 301 remains portable and easily hand-carried.

Figure 4C:
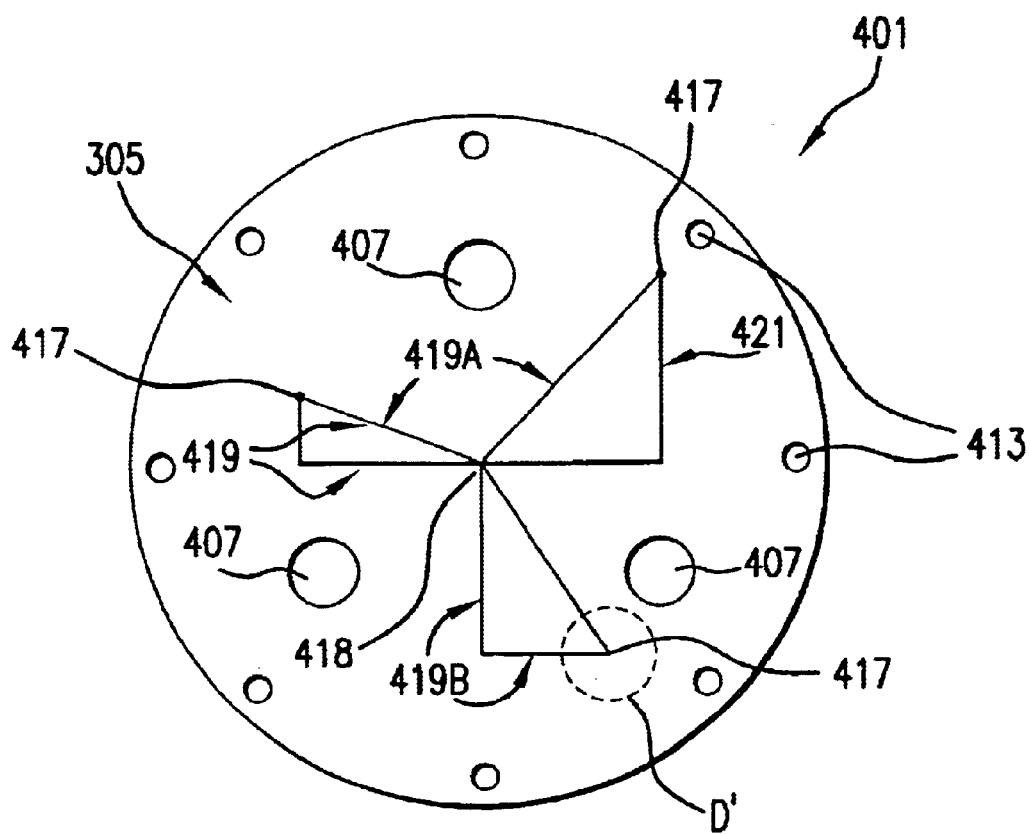
FIG. 4C shows a top view of the front plate of a planarization gauge.

FIG. 4C shows the front planar surface 305 of the front plate 401, as seen from the prober side of the ATE test cell. The front plate 401 has thru-holes 413 around its outer edge that align with the screw holes 411 on the back plate 403 so that the front plate 401 can be fastened to the back plate 403 using screws. Depth gauge access holes 407 on the front plate 401 align with the depth gauge access holes 407 on the back plate 403, and are wide enough to allow the plunger of a mechanical depth gauge to fit through. Three optical targets 417 are drawn on the surface of the front plate 401, facing the prober 107. The optical targets 417 can take any form or shape that can be detected as singular points by an upward looking camera 117. Typically, the upward looking camera 117 is designed to detect a small, light-colored area against a darker background, which is characteristic of probe tips. In the present embodiment, the surface of the front plate 401 is a dark color, and the optical target 417 is a proportionally small and visually contrasting dot. An additional optical target 418 is located at the center of the front planar surface 305. The center optical target 418 ideally lines up with the probing center of the ATE test cell. It is typically used by the upward looking camera 117 during initialization of the prober 107

Directional lines 419 drawn on the front plate 401 trace two paths from the center of the front plate 401 to each optical target 417. The first path 419A is a direct path from the center of the front plate 401 to each optical target 417. The second path 419B is broken down into x- and y-vectors. The directional lines 419 are optional, but make it much easier for an ATE operator to locate the tiny optical targets 417, especially when the front plate 401 is viewed at magnification through the view-finder of a prober vision system 117. To use the directional lines 419, the ATE operator positions the prober vision system 117 at the probing center, and then traces along the directional lines 419 on the front plate 401 towards the optical target 417 until the optical target 417 is reached.

The front plate 401 is preferably made of glass, so that the optical targets 417, 418 and directional lines 419 can be cleanly and precisely etched onto the front plate 401 using a photomask creation process. The smaller and sharper the optical targets 417, 418 are, the more accurate the measurements. Of course, the optical targets 417, 418 must not be so small as to be undetectable by the upward looking camera 117. The front plate 401 can also be made of metal, plastics, and even paper. In an actual working embodiment, the front plate 401 was fashioned out of a sheet of paper, with small white dots against a darker background to represent the optical targets 417, 418. However, using such materials may degrade the precision of the optical targets 417, 418 and affect the ability of the upward looking camera 117 to detect the optical targets 417, 418. These alternative materials may also be difficult to manufacture consistently in repeatedly similar fashion, and keep stable over time. The materials that are acceptable for use will vary depending on the ATE test cell and its manufacturing planarity tolerance. In order to be a good reference plane, the front planar surface 305 should be very flat. The planarity of the front planar surface 305 should fall within the manufacturing planarity tolerance of the ATE test cell with which it will be used. For illustrative purpose only, in an actual working embodiment, the front plate 401 is 177.8 mm in diameter and 3.81 mm thick, the front planar surface 305 is planar within 5 um, and the front planar surface 305 is parallel to the back planar surface 303 within 5 um. The total thickness of the planarization gauge 301 (the thickness of the front plate 401 and back plate 403 added together) should not exceed the maximum probe depth 116 found in probe cards 113.

Figure 4D:
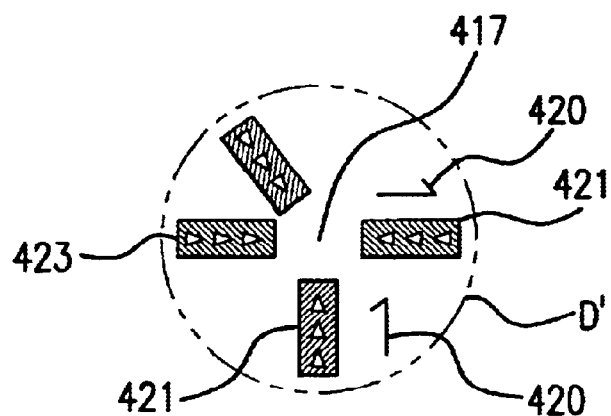
FIG. 4D shows a close-up view of the area enclosed in dashed circle D' shown in FIG. 4C.

A close-up of an optical target 417 and surrounding directional lines can be seen in FIG. 4D, which is an enlargement of the area surrounded by dashed circle D' in FIG. 4C. Arrows 423 along the length of the directional lines point towards the optical target 417. An identifying label 420 may be placed next to the optical target 417 to help the ATE operator know which optical target 417 is being viewed. Additional directional lines 421 may also be placed near the optical target 417 to help pinpoint its location. For illustrative purposes only, in an exemplary working embodiment, the optical targets 417 have a diameter of 25 um, and the directional lines are 200 um thick.

The optical targets 417 are positioned at locations that duplicate, on a smaller and proportional scale, the locations of the docking supports 111 on the prober 107 in a direct-docking system. When the planarization gauge 301 is latched to the test head 103, the optical targets 417 should be located within the radial axis of the docking supports 111 such that the ratio of each optical target radius to its respective docking support radius is the same. This method of positioning the optical targets 417 is optional, and does not have to follow this formula, especially if the planarization gauge 301 is used in a conventional docking system. However, calculating the height adjustment needed of the docking supports 111 in a direct-docking system during probe card planarization is simpler and more straightforward when the formula is followed. The depth gauge access holes 407 can also be positioned following this formula.

After the planarization gauge 301 is built, it may be calibrated to a standard such as NIST to provide measurement traceability. In an actual working embodiment, the front planar surface 305 and the back planar surface 303 were each calibrated to a NIST standard and verified to be planar within 5 um. The front planar surface 305 was also verified to be parallel to the back planar surface 303 within 5 um.

Figure 5A:
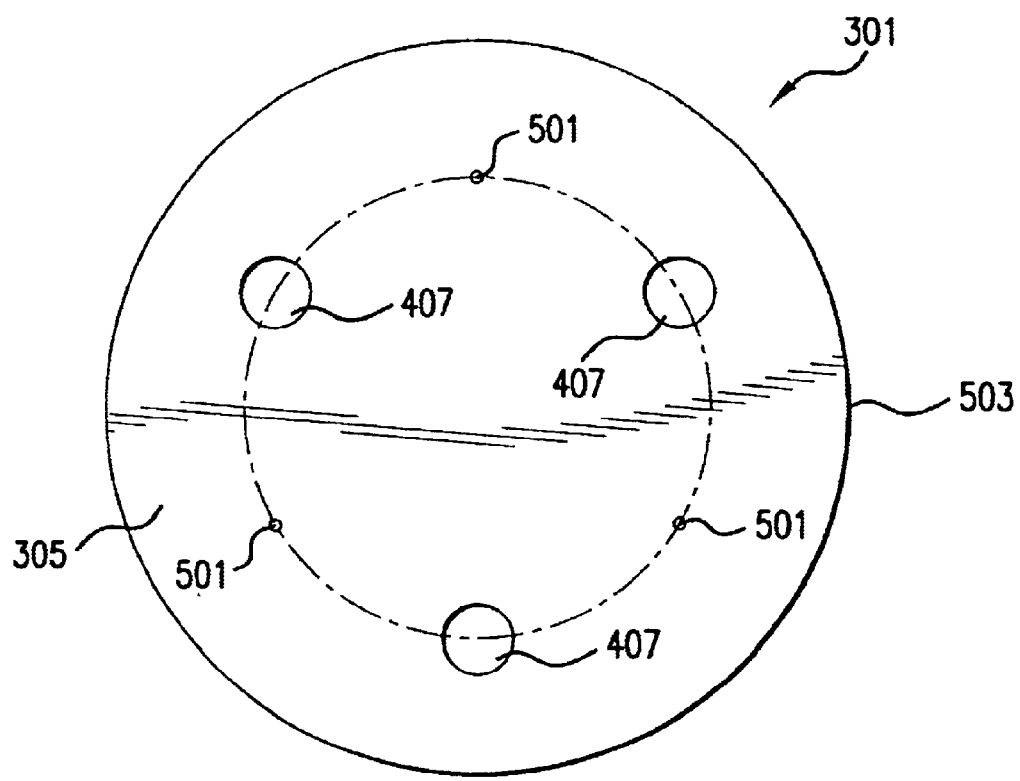
FIG. 5A shows a top view of an alternate embodiment of a planarization gauge.
Figure 5B:
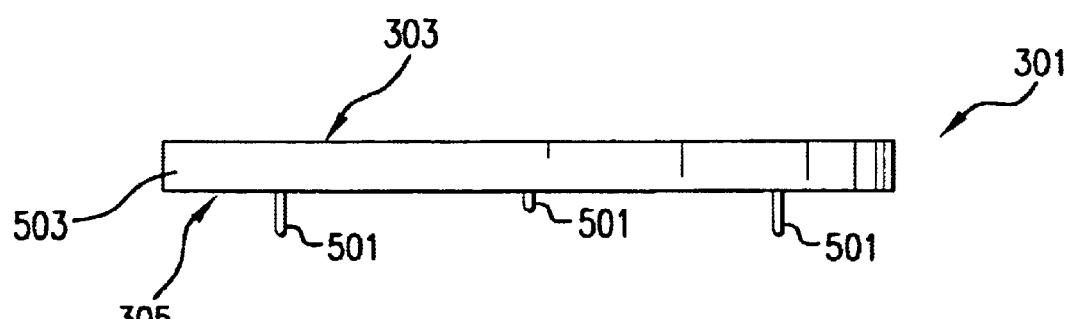
FIG. 5B shows a side view of the alternate embodiment of a planarization gauge shown in FIG. 5A.

FIG. 5A shows a top view of an alternate embodiment of the planarization gauge 301. FIG. 5B shows a side view of the same planarization gauge 301 that is shown in FIG. 5A. The optical targets in this embodiment are three probes 501 or probe-like protrusions that are attached at three different locations on the front planar surface 305 of a single plate 503. The points of the probes 501 lie in the same plane and are recognizable by an upward looking camera 117. Structures other than probes 501 may be used in this embodiment. For example, any protrusions from the single plate 503 that have an endpoint recognizable by the upward looking camera 117 can also be used. Three depth gauge access holes 407 are also provided, each one wide enough for the plunger of a mechanical depth gauge to fit through. The single plate 503 can be adapted to a fixture that loads onto a test head 103, in the same manner as a probe card 113. Although not shown in the embodiment of FIGS. 5A and 5B, directional lines 419 and a center optical target can also be included. The probes 501 can also be positioned such that the ratio of each optical target radius to a respective docking support radius is the same for all probes 501.

Figure 6:
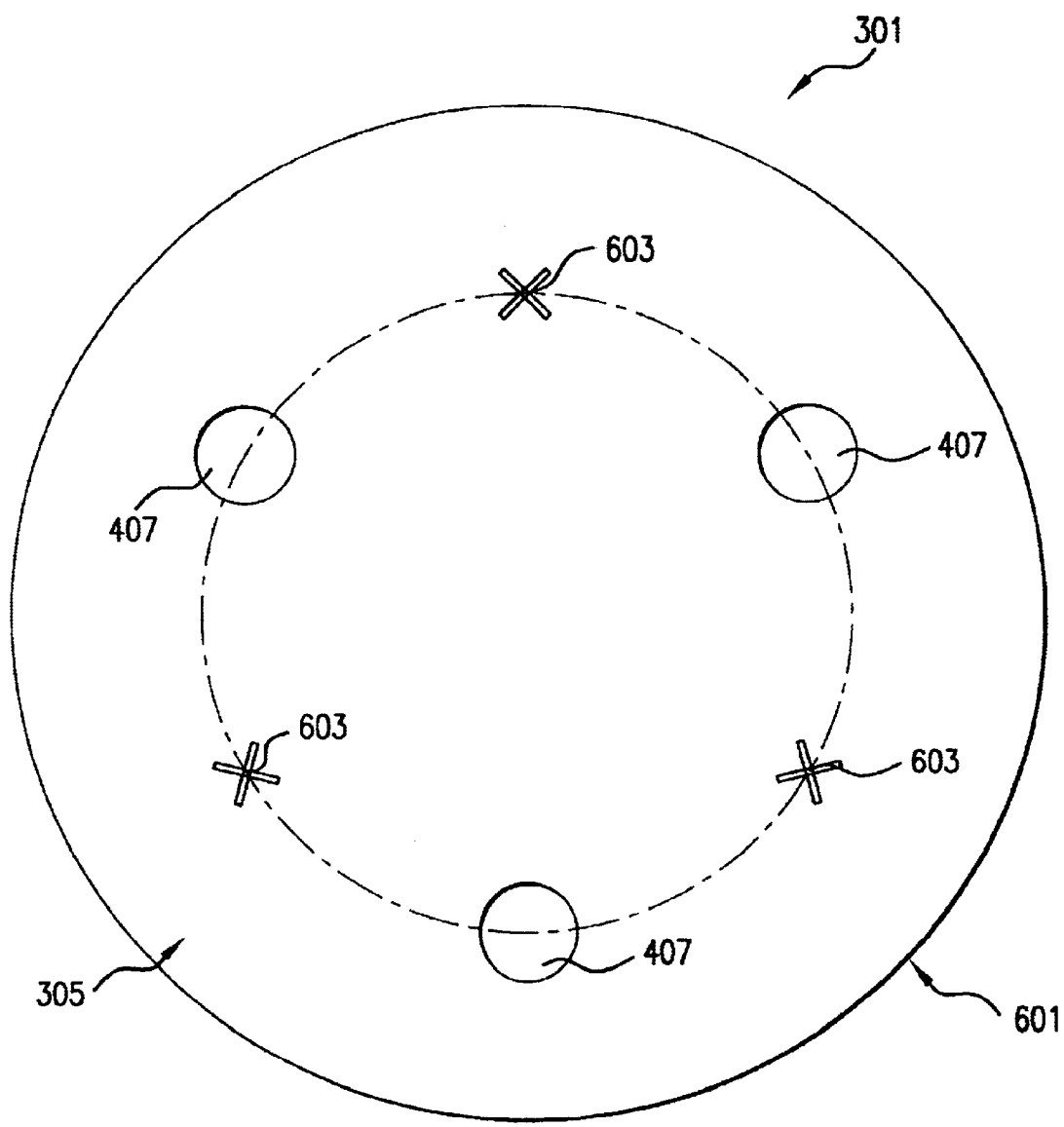
FIG. 6 shows a top view of another alternate embodiment of a planarization gauge.

FIG. 6 shows a top view of another alternate embodiment of the planarization gauge 301. A single plate 601 can be adapted to a fixture that loads onto a test head 103. The single plate 601 has three optical targets in the form of x-shaped optical targets 603 on its front planar surface 305 facing the prober 107. Each x-shaped optical target 603 is an image of a dark-colored cross with a light-colored dot in the middle. The dark-colored cross serves a function similar to the directional lines 419 shown in FIG. 4C; it helps the operator of the upward looking camera 117 to find the small, light-colored dot when looking through a magnified view-finder. Three depth gauge access holes 407 are also provided. Although not shown in the embodiment of FIG. 6, directional lines 419 and a center optical target can also be included. The x-shaped optical targets 603 can also be positioned such that the ratio of each optical target radius to a respective docking support radius is the same for all x-shaped optical targets 603.

Additional features can be easily added to any of these illustrated embodiments. For example, each optical target can be labeled with its relative height in the z-direction (z-height). This information allows an ATE operator to pre-set the docking supports 111 in a direct-docking system near their final height when the actual probe card 113 is loaded, thus minimizing setup time. The z-height of each optical target is especially useful information when multiple ATE test cells use the same probe card 113—it enables a common z-height across all probers 107. The center optical target can also be labeled with the distance it is offset from the probing center of the ATE when the planarization gauge 301 is loaded. This information is helpful in initializing the prober 107.

Although the present invention has been described in detail with reference to particular preferred embodiments, persons possessing ordinary skill in the art to which this invention pertains will appreciate that various modifications and enhancements may be made without departing from the spirit and scope of the claims that follow. For example, the plates are shown as circular in the figures, but they can be any shape so long as they can be adapted to attach to a test head 103. Also, the figures show the depth gauge access holes 407 and optical targets 417 in sets of three. However, any number and combination of depth gauge access holes 407 or optical targets 417 can be used on the planarization gauge 301. If the number of depth gauge access holes 407 is less than three, then the planarization gauge 301 must be able to be rotated in the test head 103 so as to provide at least 3 different measurements with the available depth access holes 407. Similarly, if the number of optical targets 417 is less than three, then the planarization gauge 301 must be able to be rotated in the test head 103 so as to provide at least 3 different measurements with the available optical targets 417.

We claim:

1. A planarization apparatus for use in semiconductor automatic test equipment (ATE), comprising:

a structure having at least one depth gauge access hole passing through it to provide access to the plunger of a mechanical depth gauge for measuring the distance between the structure and another point, the structure adapted to be mechanically interchangeable with a probe card, and functionally and mechanically compatible with the ATE;

a back planar surface on the structure that can function as a system reference plane for the ATE;

a front planar surface on the structure, parallel and facing opposite to the back planar surface, that can function as a system reference plane for the ATE; and at least One optical target on the front planar surface.

2. An apparatus as in claim 1, wherein the structure comprises a front plate attached to a back plate, the back planar surface is a surface on the back plate, and the front planar surface is a surface on the front plate.

3. An apparatus as in claim 2, wherein the structure has three depth gauge access holes.

4. An apparatus as in claim 2, wherein the font plate comprises glass.

5. An apparatus as in claim 2, wherein the front plate comprises paper.

6. An apparatus as in claim 2, wherein the back and front planar surfaces are planar within 5 microns and lie in substantially parallel planes.

7. An apparatus as in claim 2, wherein the optical targets are dots against a contrasting darker background.

8. An apparatus as in claim 2, wherein the optical targets are probes and the probe tips lie in a single plane.

9. An apparatus as in claim 2, wherein the optical targets an protrusions having endpoints recognizable by an upward looking camera.

10. An apparatus as in claim 2, having a center optical target in the center of the front planar surface.

11. An apparatus as in claim 10, wherein the center optical target is labeled with the distance it is offset from the probing center of the ATE.

12. An apparatus as in claim 2, wherein each docking support on the ATE has a corresponding optical target, and the ratio of each optical target radius to its corresponding docking support radius is the same.

13. An apparatus as in claim 2, further comprising directional lines that connect the center of the front planar surface to each of the optical targets.

14. An apparatus as in claim 2, wherein each optical target is labeled with its z-height.

15. An apparatus as in claim 1, wherein the structure is a single plate.

16. An apparatus as in claim 15, wherein the single plate has three depth gauge access holes.

17. An apparatus as in claim 15, wherein the back and front planar surfaces are planar within 5 microns and lie in substantially parallel planes.

18. An apparatus as in claim 15, wherein the optical targets are dots against a contrasting darker background.

19. An apparatus as in claim 15, wherein the optical targets are probes and the probe tips lie in a single plane.

20. An apparatus as in claim 15, wherein the optical targets are protrusions having endpoints recognizable by an upward looking camera.

21. An apparatus as in claim 15, having a center optical target at the center of the front planar surface.

22. An apparatus as in claim 21, wherein the center optical target is labeled with the distance it is offset from the probing center of the ATE.

23. An apparatus as in claim 15, wherein each optical target is labeled with its z-height.

24. An apparatus as in claim 15, wherein each optical target has a corresponding docking support on the ATE, and the ratio of each optical target radius to its corresponding docking support radius is the same.

25. An apparatus as in claim 15, further comprising directional lines connecting the center of the front planar surface to each of the optical targets.

26. A method for achieving probe card planarity in semiconductor automatic test equipment (ATE), comprising:

providing a planarization gauge that is interchangeable with a probe card and functionally and mechanically compatible with the ATE, the planarization gauge having at least one depth gauge access hole passing through it to provide access to the plunger of a mechanical depth gauge for measuring the distance between the planarization gauge and another point, the planarization gauge also having a back planar surface and a front planar surface parallel to the back planar surface, the front planar surface facing in a direction opposite to the back planar surface and having at least one optical target on its surface; and using the planarization gauge to correlate instruments and tools used in the probe card manufacturing and planarity verification processes.

27. A method as in claim 26, wherein the planarization gauge has three depth gauge access holes and &three optical targets.

* * * * *